United States Patent
Yang et al.

(10) Patent No.: US 8,133,767 B2
(45) Date of Patent: Mar. 13, 2012

(54) EFFICIENT INTERCONNECT STRUCTURE FOR ELECTRICAL FUSE APPLICATIONS

(75) Inventors: Chih-Chao Yang, Glenmont, NY (US); Lynne M. Gignac, Beacon, NY (US); Chao-Kun Hu, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/976,445

(22) Filed: Dec. 22, 2010

(65) Prior Publication Data

US 2011/0092031 A1 Apr. 21, 2011

Related U.S. Application Data

(62) Division of application No. 12/119,125, filed on May 12, 2008, now Pat. No. 7,893,520.

(51) Int. Cl.
*H01L 21/82* (2006.01)
(52) U.S. Cl. ........ 438/132; 438/215; 438/281; 438/333; 438/467; 438/601; 257/E21.592
(58) Field of Classification Search .................. 438/132, 438/215, 281, 333, 467, 601; 257/E21.592
See application file for complete search history.

(56) References Cited

U.S. PATENT DOCUMENTS

| | | | |
|---|---|---|---|
| 4,227,168 A | 10/1980 | Knapp, Jr. | |
| 4,228,417 A | 10/1980 | Belcher | |
| 4,240,058 A | 12/1980 | Kozacka et al. | |
| 4,245,208 A | 1/1981 | Belcher | |
| 4,254,394 A | 3/1981 | Kozacka et al. | |
| 4,272,752 A | 6/1981 | Jacobs, Jr. | |
| 4,306,212 A | 12/1981 | Belcher | |
| 5,015,604 A | 5/1991 | Lim et al. | |
| 6,078,091 A | 6/2000 | MacPherson et al. | |
| 6,265,778 B1 | 7/2001 | Tottori | |
| 6,555,458 B1 | 4/2003 | Yu | |
| 6,730,982 B2 * | 5/2004 | Barth et al. | 257/529 |
| 6,750,129 B2 | 6/2004 | Yang et al. | |
| 6,754,135 B2 | 6/2004 | Pilo | |
| 6,897,543 B1 | 5/2005 | Huang et al. | |
| 6,998,865 B2 | 2/2006 | Bard et al. | |

(Continued)

OTHER PUBLICATIONS

International Search Report dated May 18, 2009.

*Primary Examiner* — Thien F Tran
(74) *Attorney, Agent, or Firm* — Scully, Scott, Murphy & Presser, P.C.; Louis J. Percello, Esq.

(57) ABSTRACT

A semiconductor structure is provided that includes an interconnect structure and a fuse structure located in different areas, yet within the same interconnect level. The interconnect structure has high electromigration resistance, while the fuse structure has a lower electromigration resistance as compared with the interconnect structure. The fuse structure includes a conductive material embedded within an interconnect dielectric in which the upper surface of the conductive material has a high concentration of oxygen present therein. A dielectric capping layer is located atop the dielectric material and the conductive material. The presence of the surface oxide layer at the interface between the conductive material and the dielectric capping layer degrades the adhesion between the conductive material and the dielectric capping layer. As such, when current is provided to the fuse structure electromigration of the conductive material occurs and over time an opening is formed in the conductive material blowing the fuse element.

8 Claims, 5 Drawing Sheets

U.S. PATENT DOCUMENTS

| | | |
|---|---|---|
| 7,157,782 B1 | 1/2007 | Shih et al. |
| 7,272,067 B1 | 9/2007 | Huang et al. |
| 7,956,466 B2 * | 6/2011 | Hsu et al. ............ 257/758 |
| 2008/0093703 A1 | 4/2008 | Yang et al. |
| 2009/0278228 A1 | 11/2009 | Hsu et al. |
| 2009/0280636 A1 | 11/2009 | Hsu et al. |
| 2010/0013046 A1 | 1/2010 | Hotta et al. |
| 2011/0169127 A1 * | 7/2011 | Hsu et al. ............ 257/529 |

* cited by examiner

EFFICIENT INTERCONNECT STRUCTURE FOR ELECTRICAL FUSE APPLICATIONS

RELATED APPLICATION

This application is a divisional of U.S. Ser. No. 12/119,125, filed May 12, 2008, the entire contents of which are incorporated herein by reference.

FIELD OF THE INVENTION

Background of the Invention

The present invention relates to a semiconductor structure and a method of fabricating the same. More particularly, the present invention relates to a semiconductor structure that includes an efficient fuse structure (i.e., fuse element) that has lower electromigration resistance as compared to an interconnect structure, both structures are located within the same interconnect level. The present invention also provides a method of fabricating such a semiconductor structure in which a surface oxide layer is formed on the conductive material of the fuse structure. The surface oxide layer is not present on the conductive material of the interconnect structure.

Generally, semiconductor devices include a plurality of circuits which form an integrated circuit (IC) fabricated on a semiconductor substrate. A complex network of signal paths will normally be routed to connect the circuit elements distributed on the surface of the substrate. Efficient routing of these signals across the device requires formation of multilevel or multilayered schemes, such as, for example, single or dual damascene wiring structures. The wiring structure typically includes copper, Cu, since Cu based interconnects provide higher speed signal transmission between large numbers of transistors on a complex semiconductor chip as compared with aluminum, Al, based interconnects.

Within a typical interconnect structure, metal vias run perpendicular to the semiconductor substrate and metal lines run parallel to the semiconductor substrate. Further enhancement of the signal speed and reduction of signals in adjacent metal lines (known as "crosstalk") are achieved in today's IC product chips by embedding the metal lines and metal vias (e.g., conductive features) in a dielectric material having a dielectric constant of less than 4.0.

In semiconductor interconnect structures, electromigration (EM) has been identified as one metal failure mechanism. EM is one of the worst reliability concerns for very large scale integrated (VLSI) circuits. The problem not only needs to be overcome during the process development period in order to qualify the process, but it also persists through the lifetime of the chip. Voids are created inside the metal conductor of an interconnect structure due to metal ion movement caused by the high density of current flow.

Although the fast diffusion path in metal interconnects varies depending on the overall integration scheme and materials used for chip fabrication, it has been observed that metal atoms, such as Cu atoms, transported along the metal/post planarized dielectric cap interface play an important role on the EM lifetime projection. The EM initial voids first nucleate at the metal/dielectric cap interface and then grow in the direction of the bottom of the interconnect, which eventually results in a circuit dead opening.

Figure 1A:
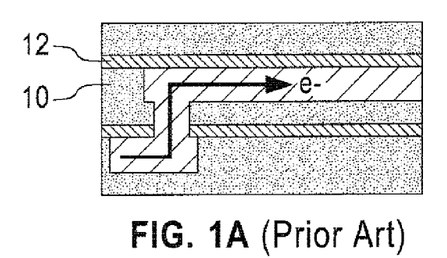
FIGS. 1A-1D are pictorial representations (through cross sectional views) illustrating the formation of a dead circuit in a prior interconnect structure which is caused by EM failure.
Figure 1B:
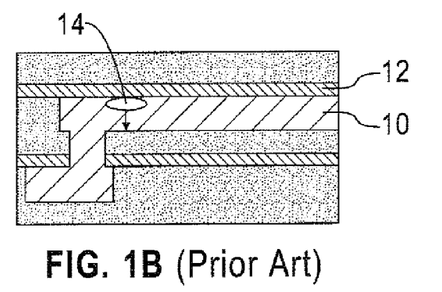
Figure 1C:
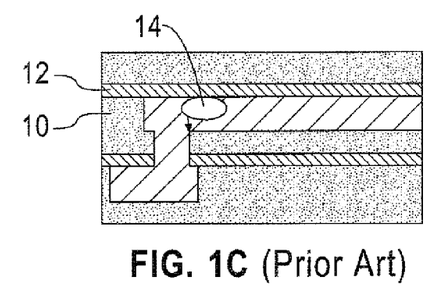
Figure 1D:
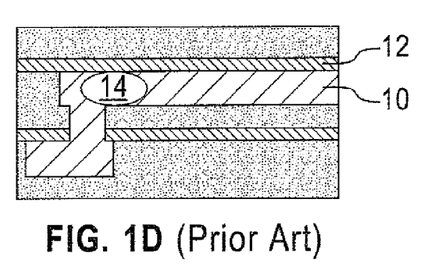

FIGS. 1A-1D are pictorial representations of a prior art interconnect structure at various stages of EM failure. In these drawings, reference numeral 12 denotes the dielectric cap, and reference numeral 10 denotes the conductive feature typically comprised of Cu or some other conductive metal; all other components of the prior art interconnect structure are not labeled to avoid obscuring the EM problem. FIG. 1A is at an initial stress stage. FIG. 1B is at a time when void 14 nucleation initiates at the conductive feature 10/dielectric cap 12 interface. FIG. 1C is at a time when the void 14 grows toward the bottom of the conductive feature 10, and FIG. 1D is at a time in which the void 14 growth crosses the conductive feature 10 causing a circuit dead opening.

Although EM causes circuit dead openings and is unwanted in interconnect structures, electrically blowable fuses take advantage of the EM effect described above to open an electrical connection; a fuse is a structure, which can be broken down or blown in accordance with a suitable electrical current, which is provided through the fuse to provide an open circuit condition. Within the context of integrated circuitry memory devices, fuses can be used to program in redundant rows of memory. Fuses have use in other integrated circuitry applications as well.

During programming of fuse structures, voids form at the center of the fuse element due to high current density, and eventually causes the conductive material to pile-up and forms hillocks at the anode (most positive) end of the fuse element. Hillock formation is an undesirable effect that has not been exploited for any useful purposes in the prior art.

Despite the separate developments of interconnect structures and fuse structures, there is still a need for integrating both structures into a single structure such that the interconnect structure has a higher electromigration (EM) resistance as compared with the fuse structure. Also, there is a need for a semiconductor structure in which the higher EM resistant interconnect structure and the lower EM resistant fuse structure are formed within the same interconnect level.

SUMMARY OF THE INVENTION

The present invention provides a semiconductor structure that includes an interconnect structure and a fuse structure located in different areas, yet within the same interconnect level. The interconnect structure has high electromigration resistance, while the fuse structure has a lower electromigration resistance as compared with the interconnect structure. The fuse structure of the present invention includes a conductive material, e.g., conductive feature, embedded within an interconnect dielectric in which the upper surface of the conductive material has a surface oxide layer present thereon. A dielectric capping layer is located atop the dielectric material and the conductive material. The presence of the surface oxide layer at an interface between the conductive material and the dielectric capping layer degrades the adhesion between the conductive material and the dielectric capping layer. As such, when current is provided to the fuse structure electromigration of the conductive material occurs and over time an opening is formed in the conductive material 'blowing' the fuse element.

In one aspect of the present invention, a programmable fuse structure is provided that comprises:

a conductive feature embedded within an interconnect dielectric material, said conductive feature having a surface oxide layer disposed thereon;

a dielectric capping layer located on said surface oxide layer and extending atop said interconnect dielectric material, said dielectric capping layer forming an interface with said surface oxide layer; and means for flowing current through said conductive feature to cause electromigration failure of a conductive material within said conductive feature for a period of time to cause an opening in said conductive feature.

In one embodiment of the present invention, the means for flowing current through said conductive feature includes a conductive electron flow within a conductive interconnect (e.g., conductive feature).

In another aspect of the present invention, a semiconductor structure is provided that comprises:

an interconnect level including a dielectric material having an interconnect area and a fuse area;

at least one conductive feature embedded within said dielectric material in said interconnect area and at least one other conductive feature embedded within said dielectric material in said fuse area;

a surface oxide layer located on an upper exposed surface of each of said at least one other conductive feature embedded within said dielectric material in said fuse area; and a dielectric capping layer located on said surface oxide layer and extending atop said dielectric material in said fuse area, said dielectric capping layer is also located atop said dielectric material and said at least one conductive feature of said interconnect area.

In addition to the above, the present invention also provides a method of forming a semiconductor structure including a high EM resistant interconnect structure and a lower EM resistant fuse structure located within a same interconnect level. The inventive method of the present invention includes:

providing an upper interconnect level atop a lower interconnect level, said upper interconnect level including a dielectric material having an interconnect area and a fuse area;

forming at least one conductive feature within said dielectric material in said interconnect area and at least one other conductive feature within said dielectric material in said fuse area;

selectively forming a surface oxide layer on an upper exposed surface of each of said at least one other conductive feature embedded within said dielectric material in said fuse area; and forming a dielectric capping layer on said surface oxide layer and extending atop said dielectric material in said fuse area, said dielectric capping layer is also located atop said dielectric material and said at least one conductive feature of said interconnect area.

In the present invention, the selectively forming the surface oxide layer includes one of chemical oxidation, physical oxidation and thermal oxidation. Preferably, a thermal oxidation process is employed to selectively provide the surface oxide layer on the upper surface of the at least one other conductive feature within the fuse area of the inventive structure. In the preferred embodiment, thermal oxidation is performed in the presence of an oxygen-containing ambient such as, for example, air, at a temperature from about 100° to about 500° C., with a temperature from about 150° to about 450° C. being even more typical. The duration of the preferred thermal oxidation may vary depending on the type of conductive material present within the at least one other conductive feature in the fuse area of the inventive structure. Typically, the duration of the thermal oxidation is from about 1 to about 20 minutes, with a duration from about 2 to about 5 minutes being even more typical.

BRIEF DESCRIPTION OF THE DRAWINGS

FIGS. 2A-7A are pictorial representations (through cross sectional views) illustrating the basic processing steps of the invention in a region of the inventive structure in which an interconnect structure is provided.

FIGS. 2B-7B are pictorial representations (through cross sectional views) illustrating the basic processing steps of the invention in a region of the inventive structure in which a fuse structure is provided.

DETAILED DESCRIPTION OF THE INVENTION

The present invention, which provides a semiconductor structure including an interconnect structure and an efficient fuse element within the same interconnect level and a method of fabricating the same, will now be described in greater detail by referring to the following discussion and drawings that accompany the present application. It is noted that the drawings of the present application are provided for illustrative purposes only and, as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As stated above, a semiconductor structure is provided that includes an interconnect structure and a fuse structure located in different areas, yet within the same interconnect level. The interconnect structure has high electromigration resistance, while the fuse structure has a lower electromigration resistance as compared with the interconnect structure. The fuse structure of the present invention includes a conductive material, e.g., conductive feature, embedded within an interconnect dielectric in which the upper surface of the conductive material has a surface oxide layer present thereon. A dielectric capping layer is located atop the dielectric material and the conductive material. The presence of the surface oxide layer at an interface between the conductive material and the dielectric capping layer degrades the adhesion between the conductive material and the dielectric capping layer. As such, when current is provided to the fuse structure electromigration of the conductive material occurs and over time an opening is formed in the conductive material 'blowing' the fuse element.

Reference is now made to FIGS. 2A-7A and FIGS. 2B-7B which illustrate the basic processing steps of the present invention in accordance with an embodiment of the invention. In the embodiment illustrated in these drawings, a closed via bottom structure is illustrated. It is observed that FIGS. 2A-7A illustrate an interconnect area of the inventive structure, while FIGS. 2B-7B illustrate a fuse area of the inventive structure. It is further observed that the interconnect area and the fuse area are located within the same interconnect level; i.e., the various areas are laterally disposed within the same interconnect level.

Figure 2A:
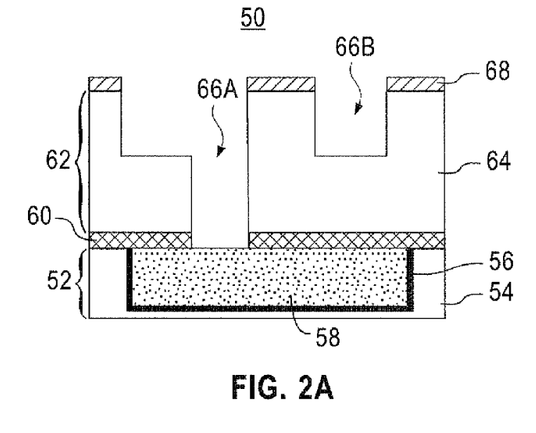
Figure 2B:
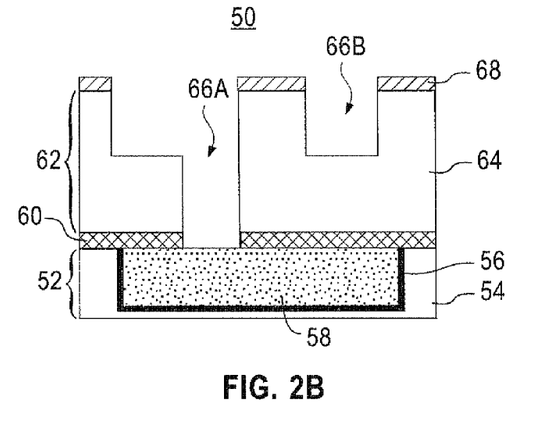

FIGS. 2A and 2B illustrate the initial structure 50 in both the interconnect area and the fuse area. The initial structure 50 in both areas is identical at this point of the present invention and it includes a lower interconnect level 52 including at least one conductive feature 58 embedded within a first dielectric material 54; only one conductive feature is shown in the drawings by way of an example. Each conductive feature 58 is separated from the first dielectric material 54 by a U-shaped diffusion barrier layer 56. The initial structure 50 also includes an upper interconnect level 62 located atop the lower interconnect level 52. A dielectric capping layer 60, which includes an opening exposing a surface portion of the conductive feature 54 within the lower interconnect level 52, separates the lower interconnect level 52 from the upper interconnect level 62. The upper interconnect level 62 at this point of the present invention includes a second dielectric material 64 which has a plurality of openings located therein. The initial structure 50 within both the interconnect area and the fuse area also includes a patterned hard mask 68 atop the second dielectric material 64. It is noted that in the drawings, the openings designated as 66A represent a combined line and via opening formed by a dual damascene process, while the openings designated as 66B represent a line opening formed by a single damascene process. Although the drawings show the presence of both types of openings, i.e., the combined line and via openings 66A and the line opening 66B, the present invention also contemplates structures in which only one of the aforementioned types of openings are employed.

The initial structure 50 shown in FIGS. 2A-2B is formed utilizing conventional methods that are well known to those skilled in the art and it is composed of materials that are also well known to those skilled in the art.

For example, the lower interconnect level 52 of the initial structure 50 is formed by first providing the first dielectric material 54 atop a substrate (not shown in the drawings of the present application). The substrate, which is not shown, may comprise a semiconducting material, an insulating material, a conductive material or any combination thereof. When the substrate is comprised of a semiconducting material, any semiconductor such as Si, SiGe, SiGeC, SiC, Ge alloys, GaAs, InAs, InP and other III/V or II/VI compound semiconductors may be used. In addition to these listed types of semiconducting materials, the present invention also contemplates cases in which the semiconductor substrate is a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or a combination thereof including multilayers. When the substrate is a conducting material, the substrate may include, for example, polySi, an elemental metal, alloys of elemental metals, a metal silicide, a metal nitride or combinations thereof including multilayers. When the substrate comprises a semiconducting material, one or more semiconductor devices such as, for example, complementary metal oxide semiconductor (CMOS) devices can be fabricated thereon. When the substrate comprises a combination of an insulating material and a conductive material, the substrate may represent a first interconnect level of a multilayered interconnect structure.

The first dielectric material 54 of the lower interconnect level 52 comprises any interlevel or intralevel dielectric including inorganic dielectrics or organic dielectrics. The first dielectric material 54 may be porous or non-porous. Some examples of suitable dielectrics that can be used as the first dielectric material 54 include, but are not limited to $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The first dielectric material 54 typically has a dielectric constant that is about 4.0 or less, with a dielectric constant of about 2.8 or less being even more typical. All dielectric constants mentioned herein are relative to a vacuum, unless otherwise noted. These dielectrics generally have a lower parasitic cross talk as compared with dielectric materials that have a higher dielectric constant than 4.0. The thickness of the first dielectric material 54 may vary depending upon the dielectric material used as well as the exact number of dielectrics layers within the first dielectric material 54. Typically, and for normal interconnect structures, the first dielectric material 54 has a thickness from about 50 to about 1000 nm.

The first dielectric material 54 is deposited on the surface of the substrate (not shown) utilizing any conventional deposition process including, but not limited to chemical vapor deposition (CVD), plasma enhanced chemical vapor deposition (PECVD), spin-on coating, evaporation, and chemical solution deposition.

After forming the first dielectric material 54, a plurality of openings (which will subsequently house the conductive features within the lower interconnect level 52) are formed into the dielectric material 54 utilizing lithography and etching. The lithographic process includes forming a photoresist (not shown) atop the first dielectric material 54, exposing the photoresist to a desired pattern of radiation and developing the exposed photoresist utilizing a conventional resist developer. The etching process includes a dry etching process (such as, for example, reactive ion etching, ion beam etching, plasma etching or laser ablation), and/or a wet chemical etching process. Typically, reactive ion etching is used in providing the openings to the first dielectric material 54.

The depth of each opening that is formed into the first dielectric material 54 (measured from the upper surface of the dielectric material to the bottom wall of the opening) may vary and it is not critical to the present application. In some embodiments, each of the openings may extend entirely through the first dielectric material 54. In yet other embodiments, each of the openings stops within the first dielectric material 54 itself. In yet further embodiments, different depth openings can be formed.

Next, a diffusion barrier 56, which represents a first diffusion barrier of the inventive structure, is formed on all exposed surfaces of the structure including atop the first dielectric material 54 as well as within each of the openings (i.e., on sidewalls and the bottom wall of each of the openings). The diffusion barrier 56 comprises Ta, TaN, Ti, TiN, Ru, RuN, RuTa, RuTaN, W, WN or any other material that can serve as a barrier to prevent a conductive material from diffusing there through. The thickness of the diffusion barrier 56 may vary depending on the deposition process used as well as the material employed. Typically, the diffusion barrier 56 has a thickness from about 2 to about 50 nm, with a thickness from about 5 to about 20 nm being more typical.

The diffusion barrier 56 is formed by a deposition process including, for example, chemical vapor deposition (CVD), plasma enhanced chemical vapor deposition (PECVD), atomic layer deposition (ALD), physical vapor deposition (PVD), sputtering, chemical solution deposition and plating.

At least one conductive feature 58, each of which includes a conductive material, is then formed within each of the openings that are now lined with at least diffusion barrier 56. The conductive material of each of the conductive features 58 may comprise polySi, SiGe, a conductive metal, an alloy comprising at least one conductive metal, a conductive metal silicide or combinations thereof. Preferably, the conductive material of each of the conductive features 58 is a conductive metal such as Cu, W or Al, with Cu or a Cu alloy (such as AlCu) being highly preferred in the present invention. It is noted that each conductive feature 58 collectively represents a first conductive feature of the inventive structure.

Any conventional deposition process including chemical vapor deposition (CVD), plasma enhanced chemical vapor deposition (PECVD), sputtering, chemical solution deposition or plating that fills the at least one opening from the bottom upwards can be used to provide each conductive feature 58 of the initial structure 50. Preferably, a bottom-up plating process is employed.

Next, a planarization process including, for example, chemical mechanical polishing and/or grinding is performed to complete the fabrication of the lower interconnect level 52. Typically, chemical mechanical polishing is employed.

A dielectric capping layer 60, which represents a first dielectric capping layer of the inventive structure, is then formed atop the lower interconnect level 52. The dielectric capping layer 60 comprises any suitable dielectric capping material such as, for example, SiC, $Si_4NH_3$, $SiO_2$, a carbon doped oxide, a nitrogen and hydrogen doped silicon carbide SiC(N, H) or multilayers thereof. Any conventional deposition process such as, for example, chemical vapor deposition, plasma enhanced chemical vapor deposition, chemical solution deposition, evaporation, and atomic layer deposition may be used in forming the dielectric capping layer 60. The thickness of the dielectric capping layer 60 may vary depending on the technique used to form the same as well as the material make-up of the layer. Typically, the dielectric capping layer 60 has a thickness from about 15 to about 100 nm, with a thickness from about 25 to about 45 nm being more typical.

Next, the upper interconnect level 62 is formed by applying the second dielectric material 64 to the upper exposed surface of the dielectric capping layer 60. The second dielectric material 64 may comprise the same or different, preferably the same, interconnect dielectric material as that of the first dielectric material 54 of the lower interconnect level 52. The processing techniques and thickness ranges for the first dielectric material 54 are also applicable here for the second dielectric material 64. The second dielectric material 64 can also comprise two different materials, i.e., deposition of one dielectric material first, followed by deposition of a different dielectric material. In one embodiment of the present invention, the second dielectric material 64 comprises two different low k dielectric materials and thus the upper interconnect level 62 has a hybrid structure with the subsequently filled conductively filled line embedded in a porous dielectric material, and the subsequently filled via embedded in a dense (i.e., non porous) dielectric material. In such an embodiment, the porous low k dielectric has a dielectric constant of about 2.8 or less, and the dense porous low k dielectric has a dielectric constant of about 4.0 or less.

A blanket layer of a hard mask material is then formed atop the upper surface of the second dielectric material 64. The blanket layer of hard mask material includes an oxide, nitride, oxynitride or any combination including multilayers thereof. Typically, the hard mask material is an oxide such as $SiO_2$ or a nitride such as $Si_3N_4$. The blanket layer of hard mask material is formed utilizing a conventional deposition process such as, for example, CVD, PECVD, chemical solution deposition or evaporation. The thickness of the as-deposited layer of hard mask material may vary depending upon the type of hard mask material formed, the number of layers that make up the hard mask material and the deposition technique used in forming the same. Typically, the as-deposited layer of hard mask material has a thickness from about 10 to about 80 nm, with a thickness from about 20 to about 60 nm being even more typical.

After forming the blanket layer of hard mask material, a photoresist (not shown) is formed atop the hard mask material utilizing a conventional deposition process such as, for example, CVD, PECVD, spin-on coating, chemical solution deposition or evaporation. The photoresist may be a positive-tone material, a negative-tone material or a hybrid material, each of which is well known to those skilled in the art. The photoresist is then subjected to a lithographic process which includes exposing the photoresist to a pattern of radiation and developing the exposed resist utilizing a conventional resist developer. The lithographic step provides a patterned photoresist atop the blanket layer of hard mask material.

After providing the patterned photoresist, a single damascene, dual damascene or combination of single and dual damascene is then performed. Single and dual damascene processes are well known to those skilled in the art and, as such, the details concerning the same are not provided herein. Generally, in a single or dual damascene process the pattern within the patterned photoresist is first transferred into the hard mask material forming patterned hard mask 68 and then subsequently into the second dielectric material 64 utilizing one or more etching processes. The patterned photoresist can be stripped immediately after the pattern is transferred into the hard mask forming patterned hard mask 68 utilizing a conventional stripping process. Alternatively, the patterned photoresist can be stripped after the pattern is transferred into the second dielectric material 64. The etching used in transferring the pattern may comprise a dry etching process, a wet chemical etching process or a combination thereof. The term "dry etching" is used herein to denote an etching technique such as reactive-ion etching, ion beam etching, plasma etching or laser ablation. A dual damascene process includes another iteration of patterning and etching.

It is again noted that in the drawings, the openings designated as 66A represent a combined line and via opening formed by a dual damascene process, while the openings designated as 66B represent a line opening formed by a single damascene process. Although the drawings show the presence of both types of openings, i.e., the combined line and via openings 66A and the line opening 66B, the present invention also contemplates structures in which only one of the aforementioned types of openings are employed.

It is observed that during the formation of the openings within the second dielectric material 64, one of the etching steps also removes a portion of the dielectric capping layer 60 that is located atop the conductive feature 58 embedded within the first dielectric material 54.

Figure 3A:
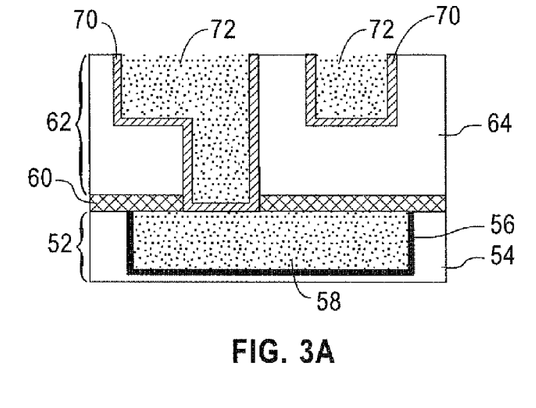
Figure 3B:
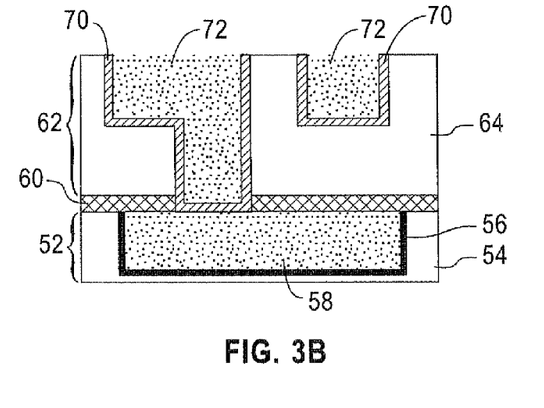

Next, and as shown in FIGS. 3A-3B, a diffusion barrier 70 and a conductive material (which after planarization subsequently forms a conductive feature 72 in the upper interconnect level) are formed into the openings within the interconnect area and the fuse area and thereafter the structure is subjected to a conventional planarization process such as, for example, chemical mechanical polishing and/or grinding. It is observed that during the planarization process the patterned hard mask 68 is typically removed from the structure providing a structure in which the upper surfaces of the diffusion barrier 70 and the conductive feature 72 within the upper interconnect level are coplanar with the upper surface of the second dielectric material 64.

The diffusion barrier 70, which represents a second diffusion barrier used in the invention, is formed on all exposed surfaces (horizontal and vertical) of the structure shown in FIGS. 2A-2B. In accordance with the present invention, the diffusion barrier 70 comprises Ta, TaN, Ti, TiN, Ru, RuN, RuTa, RuTaN, W, WN or any other material that can serve as a barrier to prevent a conductive material from diffusing there through. Combinations of these materials are also contemplated forming a multilayered stacked diffusion barrier. The diffusion barrier 70 is formed utilizing a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating.

The thickness of the diffusion barrier 70 may vary depending on the number of material layers within the barrier, the technique used in forming the same as well as the material of the diffusion barrier itself. Typically, the diffusion barrier 70 has a thickness from about 4 to about 40 nm, with a thickness from about 7 to about 20 nm being even more typical.

In some embodiments, an adhesion/plating seed layer (not specifically shown) is also formed atop the diffusion barrier 70; in embodiments when the adhesion/plating seed layer is used, reference numeral 70 represents a material stack including both the diffusion barrier and the optional adhesion/plating seed layer. When employed, the optional adhesion/plating seed layer is comprised of a metal or metal alloy from Group VIIIA of the Periodic Table of Elements. Examples of suitable Group VIIIA elements for the adhesion/plating seed layer include, but are not limited to Ru, TaRu, Ir, Rh, Pt, Pd and alloys thereof. In some embodiments, it is preferred to use Ru, Ir or Rh as the optional adhesion/plating seed layer. The optional adhesion/plating seed layer is formed by a conventional deposition process including, for example, chemical vapor deposition (CVD), plasma enhanced chemical vapor deposition (PECVD), atomic layer deposition (ALD), plating, sputtering and physical vapor deposition (PVD). The thickness of the optional adhesion/plating seed layer may vary depending on number of factors including, for example, the compositional material of the adhesion/plating seed layer and the technique that was used in forming the same. Typically, the optional adhesion/plating seed layer has a thickness from about 0.5 to about 10 nm, with a thickness of less than 6 nm being even more typical.

The conductive feature 72, which represents a second conductive feature within the inventive structure, may comprise the same or different, preferably the same, conductive material (with the proviso that the conductive material is not polysilicon) as that of the conductive feature 58 within the first dielectric material 54. Preferably, Cu, Al, W or alloys thereof are used, with Cu or AlCu being most preferred. The conductive material is formed utilizing the same deposition processing as described above in forming the conductive feature 58 within the first dielectric material 54. Note that the conductive features 72 in the interconnect area are referred to in the claims as at least one conductive feature, while the conductive features 72 in the fuse area are referred to in the claims as at least one other conductive feature.

Figure 4A:
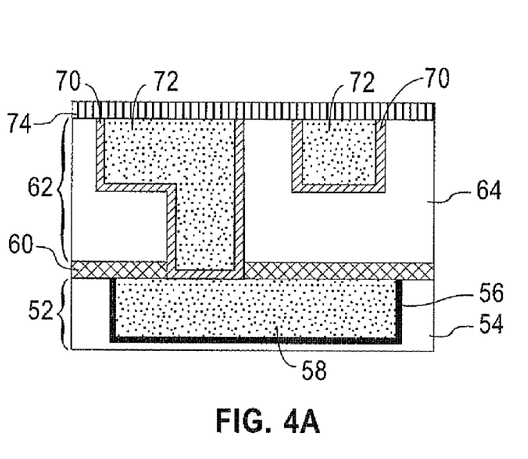
Figure 4B:
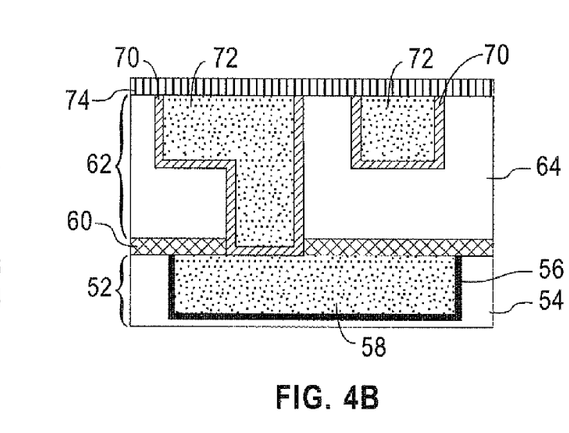

At this point of the inventive process, a second dielectric capping layer 74 is formed on the exposed surfaces of the upper interconnect level 62 shown in FIGS. 3A-3B providing the structure shown in FIGS. 4A-4B; note that the second dielectric capping layer 74 is present in both the interconnect area and the fuse area of the inventive structure. The second dielectric capping layer 74 may comprise the same or different material as first dielectric capping layer 60. Also, the second dielectric capping layer 74 may be formed utilizing one of the deposition processes used in forming the first dielectric capping layer 60 and the thickness of the second dielectric capping layer 74 is typically within the thickness range provided above for the first dielectric capping layer 60 as well.

Figure 5A:
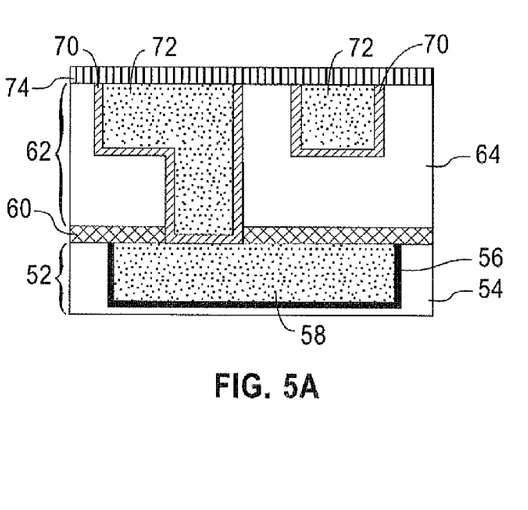
Figure 5B:
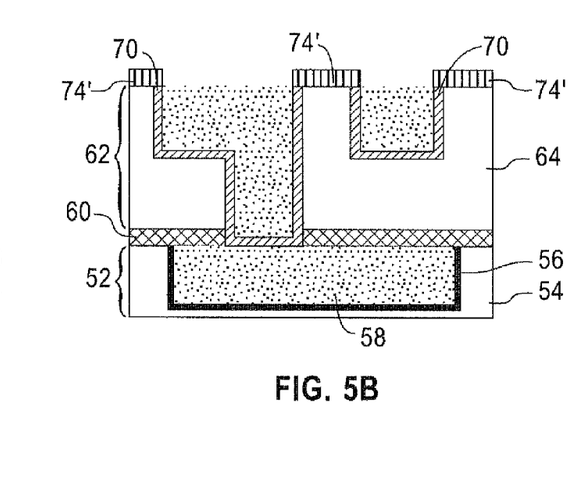

FIGS. 5A-5B illustrate the structure that is formed after selectively patterning the second dielectric capping layer 74 within the fuse area to form a patterned dielectric capping layer 74' in the fuse area. The selectively patterning step includes providing a photoresist (not shown) atop the second dielectric capping layer 74 in both the interconnect area and the fuse area, patterning the photoresist by conventional lithography and etching (including one of dry etching or chemical wet etching). The patterned photoresist is stripped from the structure after the etching step providing the structure shown in FIGS. 5A-5B. It is noted that in FIG. 5B, the upper surface of each of the conductive features 72 within the fuse area is exposed.

Figure 6A:
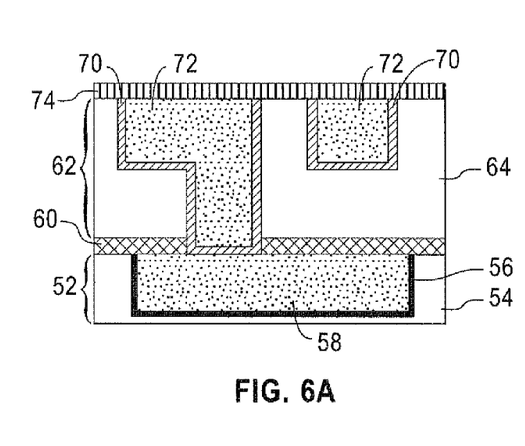
Figure 6B:
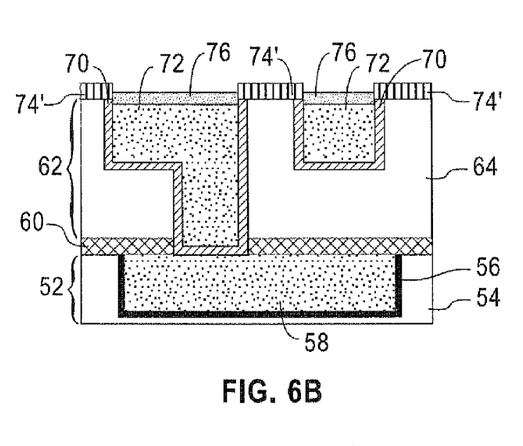

FIGS. 6A-6B illustrate the structure that is formed after forming a surface oxide layer 76 on the exposed surfaces of each of the conductive features 72 within the fuse area. The surface oxide layer 76 may be formed utilizing any oxidation process including for example, chemical oxidation, physical oxidation, thermal oxidation or combinations thereof.

When chemical oxidation is employed, any chemical oxidizing agent including, for example, $O_2$, $CO_2$ and CO can be employed. The chemical oxidation may be performed at nominal room temperature, i.e., at a temperature from about 20° C. to about 40° C., or a temperature that is greater than nominal room temperature (typically within a range from about 100° C. to about 500° C., with a temperature from about 150° to about 450° C. being even more typical). The duration of the chemical oxidation may vary and is not critical to the present invention so long as it is capable of forming the surface oxide layer 76. Typically, the duration of chemical oxidation is from about 1 to about 20 minutes, with a duration from about 2 to about 5 minutes being even more typical.

When physical oxidation is employed, a plasma including an oxidizing species is provided and the exposed surfaces of the conductive features 72 are subjected to plasma oxidation. Illustrative examples of oxidizing species include $O_2$. The plasma oxidation may be performed at nominal room temperature, i.e., a temperature from about 20° C. to about 40° C., or a temperature that is greater than nominal room temperature (typically within a range from about 100° C. to about 500° C., with a temperature from about 150° to about 450° C. being even more typical). The duration of the plasma oxidation may vary and is not critical to the present invention so long as it is capable of forming the surface oxide layer 76. Typically, the duration of plasma oxidation is from about 1 to about 20 minutes, with a duration from about 2 to about 5 minutes being even more typical.

When thermal oxidation is employed, a gas or vapor including an oxygen-containing ambient is provided and the exposed surfaces of the conductive features 72 are subjected to thermal oxidation. Illustrative examples of oxygen-containing ambients include $O_2$, $CO$ and $CO_2$. The thermal oxidation may be performed at a temperature from about 100° C. to about 500° C., with a temperature from about 150° to about 450° C. being even more typical. The duration of the thermal oxidation may vary and is not critical to the present invention so long as it is capable of forming the surface oxide layer 76. Typically, the duration of the thermal oxidation is from about 1 to about 20 minutes, with a duration from about 2 to about 5 minutes being even more typical.

Notwithstanding the type of oxidation process employed, the surface oxide layer 76 has a higher content of oxygen that the underlying conductive feature 72. The oxygen content with the surface oxide layer is typically from about 2 to about 80 atomic percent, with an oxygen content from about 10 to about 50 atomic percent being even more typical. In comparison, the underlying conductive feature 72 is free of any oxygen content. Moreover, the thickness of the surface oxide layer 76 may vary depending on the exact conditions of the oxidation process employed. Typically, the surface oxide layer 76 formed on the conductive features 72 within the fuse area of the inventive structure has a thickness from about 2 to about 30 Å, with a thickness from about 5 to about 10 Å being even more typical.

Of the various oxidations mentioned above, it is preferred to use a thermal oxidation process in which air is used to oxidize the exposed surfaces of the conductive features 72 within the fuse area. When a thermal oxidation is employed, the surface oxide layer may be referred to as a thermal oxide.

Figure 7A:
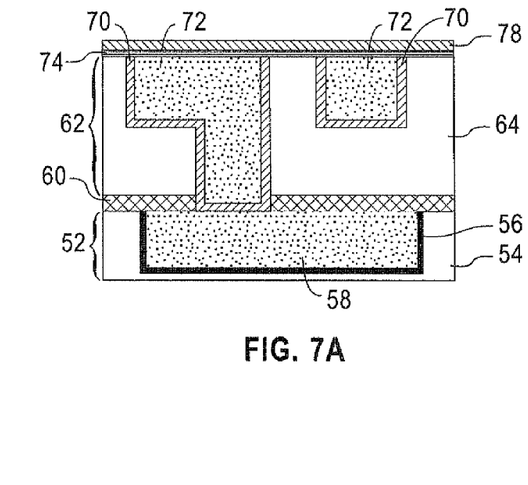
Figure 7B:
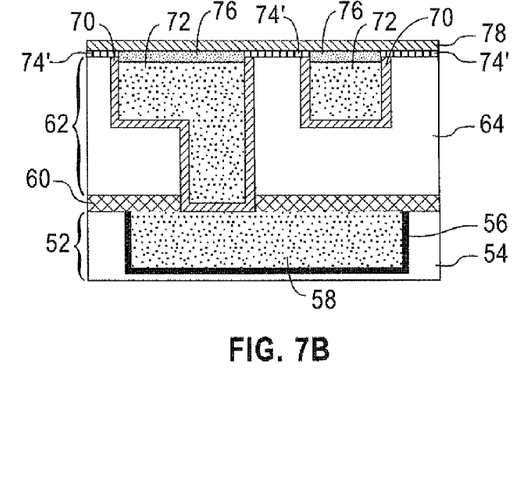

FIGS. 7A-7B show the structure after forming a third dielectric capping layer 78 atop the second dielectric capping layer 74 within the interconnect area and atop the remaining second dielectric capping layer 74 and the surface oxide layer 76 in the fuse area. The third dielectric capping layer 78 may be comprised of the same or different dielectric capping material as the second dielectric capping layer 74. Typically, the second and third dielectric capping layers are comprised of the same dielectric capping material. It is observed that the third dielectric capping layer 78 may be formed utilizing the same processes as discussed above for the first dielectric capping layer 60. The thickness of the third dielectric capping layer 78 may vary and it is typically within the ranges mentioned above for the first dielectric capping layer 60.

Figure 8A:
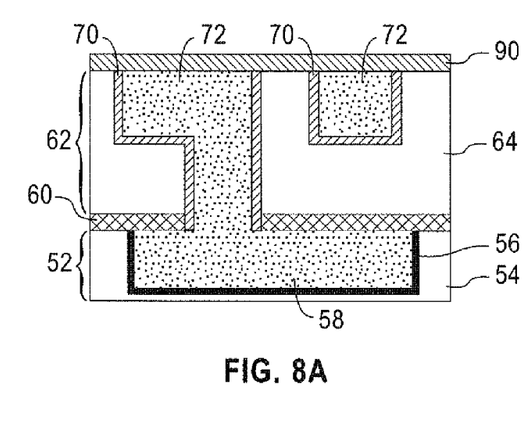
FIGS. 8A-8B are pictorial representations (through cross sectional views) illustrating a structure within an interconnect area and fuse area, respectively, in which an open via bottom is provided.
Figure 8B:
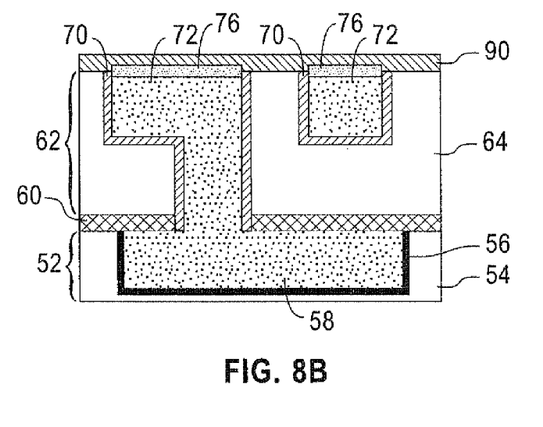

FIGS. 8A-8B represent another embodiment of the present invention in which the structure includes an open via bottom; FIGS. 2A-7B described above represent an embodiment in which the structure has a closed via bottom. In the open via bottom structure, the conductive feature 58 within the first dielectric material 54 is in direct physical contact with the conductive feature 72 within the second dielectric material 64. The open via structure is formed by removing the second diffusion barrier 70 and optional plating seed layer from the bottom of via opening utilizing ion bombardment or another like directional etching process. The formation of the open via bottom occurs between the formation of the second diffusion barrier 70 (and optional plating seed layer) and the filling of the openings within the second dielectric material 64 with the conductive material that forms the second conductive feature 72. In FIGS. 5A-8B, reference numeral 90 denotes a combination of the second and third diffusion barriers.

Figure 9A:
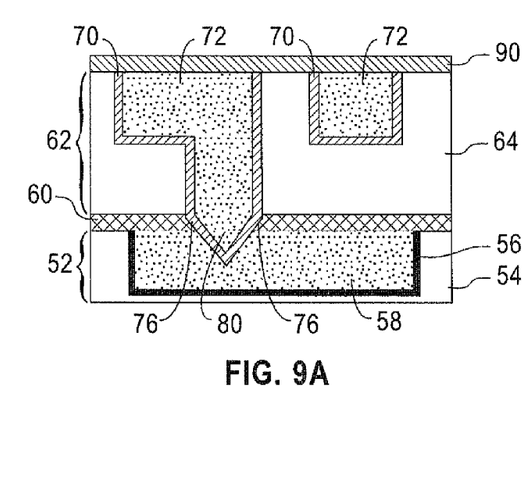
FIGS. 9A-9B are pictorial representations (through cross sectional views) illustrating a structure within an interconnect area and fuse area, respectively, in which a via gouging feature is provided.
Figure 9B:
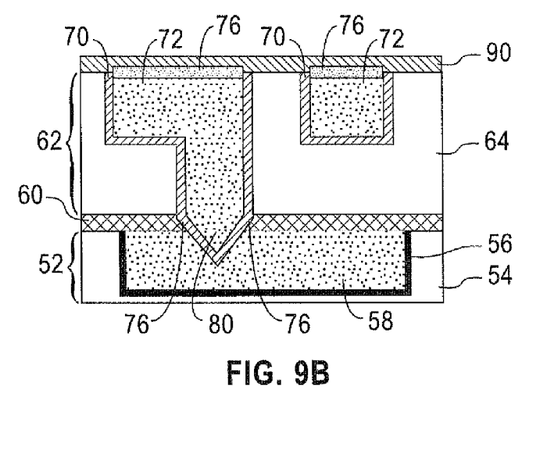

FIGS. 9A-9B represent a yet further embodiment of the invention in which a via gouging feature 80 is formed. In this embodiment, argon sputtering is employed prior to deposition of the second diffusion barrier 70 within the openings provided in the second dielectric material 64 to clean the bottom horizontal surface within the via opening and form a gouging feature 80, i.e., anchoring area, into the first conductive feature 58 of the lower interconnect level 52. The gouging feature 80 is employed to enhance the interconnect strength between the various interconnect levels shown. After forming the gouging feature, the second diffusion barrier 70 and the second conductive feature 72 are then formed. Next, the remaining processing steps mentioned above are performed to provide the structure shown in FIGS. 9A-9B. In FIGS. 9A-9B, reference numeral 90 denotes a combination of the second and third diffusion barriers.

It is observed that although the drawings depict the interconnect area and the fuse area having the same type of via structure (i.e., closed via bottom, open via bottom, or via gouging feature), the present invention also contemplates embodiments in which the interconnect area and the fuse area have different via structures (i.e., one being a closed via bottom and the other being an open via bottom, etc.). Such structures are formed by forming a block mask over one of the areas during the formation of the via structure.

It is further observed that in each of the different embodiments mentioned above a semiconductor structure (see, for example, FIGS. 7A-7B, 8A-8B and 9A-9B) is provided that includes an interconnect structure within the interconnect area and a fuse structure located within the fuse area. The interconnect structure and the fuse structure are located within the same interconnect level, i.e., the upper interconnect level 62. The interconnect structure within interconnect area has high electromigration resistance, while the fuse structure within the fuse area has a lower electromigration resistance as compared with the interconnect structure. The fuse structure of the present invention includes a conductive material (i.e., second conductive feature 72) embedded within an interconnect dielectric (i.e., the second dielectric material 64) in which the upper surface of the conductive material (i.e., the second conductive feature 72) has a surface oxide layer 76 present thereon. A dielectric capping layer (i.e., the third dielectric capping layer 78) is located atop the second dielectric material 64 and the second conductive feature 72. The presence of the surface oxide layer 76 at an interface between the second conductive features 72 and the third dielectric capping layer 78 degrades the adhesion between the conductive feature and the dielectric capping layer. As such, when current is provided to the fuse structure electromigration of the conductive material within the second conductive feature occurs and over time an opening is formed in the second conductive feature 'blowing' the fuse element.

It is also observed that FIGS. 7B, 8B and 9B illustrate the inventive programmable fuse structure of the invention. Specifically, the inventive programmable fuse structure includes a conductive feature (represented by reference numeral 72) embedded within an interconnect dielectric material (represented by second dielectric material 64). The conductive feature has a surface oxide layer (represented by reference numeral 76) disposed thereon. The inventive programmable fuse structure also includes a dielectric capping layer (represented by third dielectric capping layer 78) located on the surface oxide layer 76 and extending atop the interconnect dielectric material (i.e., second dielectric layer 64). The dielectric capping layer (i.e., third dielectric capping layer 78) also forms an interface with the surface oxide layer 76. The means for flowing current through the conductive feature to cause electromigration failure of a conductive material within said conductive feature for a period of time to cause an opening in the conductive feature is not specifically shown and the depiction of the same is not needed to understand the scope of the invention. The means for flowing current includes a conductive electron flow in a conductive interconnect structure.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a semiconductor structure including a high EM resistant interconnect structure and a lower EM resistant fuse structure located within a same interconnect level, said method comprising:
   providing an upper interconnect level atop a lower interconnect level, said upper interconnect level including a dielectric material having an interconnect area and a fuse area;
   forming at least one conductive feature within said dielectric material in said interconnect area and at least one other conductive feature within said dielectric material in said fuse area;
   selectively forming a surface oxide layer on an upper exposed surface of each of said at least one other conductive feature embedded within said dielectric material in said fuse area; and
   forming a dielectric capping layer on said surface oxide layer and extending atop said dielectric material in said fuse area, said dielectric capping layer is also located atop said dielectric material and said at least one conductive feature of said interconnect area.

2. The method of claim 1 wherein said forming said at least one conductive feature and said at least one other conductive feature includes a single damascene process or a dual damascene process.

3. The method of claim 1 wherein said selectively forming said surface oxide layer includes applying a pattered photoresist to the interconnect area to protect the dielectric material and the at least one conductive feature in said interconnect area, exposing said upper surface of each of said at least one other conductive feature, and then performing one of a chemical oxidation, a physical oxidation and a thermal oxidation.

4. The method of claim 3 wherein a thermal oxidation is employed, and said thermal oxidation is performed in an oxygen-containing ambient at a temperature from about 100° C. to about 500° C.

5. The method of claim 4 wherein said oxygen-containing ambient is air.

6. The method of claim 3 wherein a chemical oxidation is employed, and said chemical oxidation is performed using an oxidizing species at a temperature from about room temperature to about 500° C.

7. The method of claim 3 wherein a physical oxidation is employed, and said physical oxidation is performed using a plasma including an oxidizing species at a temperature from about 100° C. to about 500° C.

8. The method of claim 3 wherein surface oxide layer has a higher oxygen content than said at least one other conductive feature and said higher oxygen content is from about 10 to about 50 atomic percent oxygen.

* * * * *